US010187051B2

(12) United States Patent
Kondapalli

(10) Patent No.: US 10,187,051 B2
(45) Date of Patent: Jan. 22, 2019

(54) CIRCUIT FOR CONTROLLING GATE CURRENT OF A SEMICONDUCTOR SWITCHING DEVICE

(71) Applicant: Hitachi, Ltd., Chiyoda-ku, Tokyo (JP)

(72) Inventor: Ramachandra Sekhar Kondapalli, Bangalore (IN)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/903,793

(22) Filed: Feb. 23, 2018

(65) Prior Publication Data

US 2018/0254776 A1 Sep. 6, 2018

(30) Foreign Application Priority Data

Mar. 2, 2017 (IN) .............................. 201741007398

(51) Int. Cl.
*H03K 3/00* (2006.01)
*H03K 17/16* (2006.01)
*H01F 29/14* (2006.01)

(52) U.S. Cl.
CPC ........... *H03K 17/162* (2013.01); *H01F 29/14* (2013.01)

(58) Field of Classification Search
CPC .............................. H03K 17/162; H01F 29/14
See application file for complete search history.

(56) References Cited

U.S. PATENT DOCUMENTS

| | | | |
|---|---|---|---|
| 8,054,110 B2 * | 11/2011 | Wang | H03K 19/018521 327/108 |
| 8,120,457 B2 | 2/2012 | Hu et al. | |
| 8,456,201 B2 * | 6/2013 | Olivo | H03K 17/163 327/110 |
| 8,717,085 B2 * | 5/2014 | Cioci | H03K 17/567 327/427 |
| 9,391,548 B2 | 7/2016 | Park et al. | |
| 9,494,964 B2 * | 11/2016 | Kawai | H02M 1/08 |
| 9,584,117 B1 * | 2/2017 | Wang | H03K 17/687 |
| 9,998,110 B2 * | 6/2018 | Zojer | H03K 17/162 |

* cited by examiner

*Primary Examiner* — Kenneth B Wells
(74) *Attorney, Agent, or Firm* — Foley & Lardner LLP

(57) ABSTRACT

The present disclosure discloses a circuit and a method for controlling gate current of a semiconductor switching device. The circuit comprises a current controlled variable inductor connected to a gate terminal of the semiconductor switching device and a feedback control circuit. The feedback control circuit comprises a differential module to compute an instantaneous rate of change of gate current with respect to time, a reference generator to generate a reference voltage and a control unit to regulate value of inductance of the variable inductor for controlling the gate current of the semiconductor switching device.

12 Claims, 7 Drawing Sheets

CIRCUIT FOR CONTROLLING GATE CURRENT OF A SEMICONDUCTOR SWITCHING DEVICE

TECHNICAL FIELD

The present disclosure relates to a semiconductor switching device. More specifically, but not exclusively, the present disclosure discloses a feedback control circuit for regulating gate current of the semiconductor switching device for optimal operation of the semiconductor switching device.

BACKGROUND

In a semiconductor switching device like a Field Effect Transistor (FET) or a Metal Oxide Semiconductor Field Effect Transistor (MOSFET), Insulated gate bipolar transistor (IGBT), Bipolar junction transistor (BJT) commonly used to get a chopped wave from constant DC source. In the process of chopping, the switching devices are vulnerable to both electromagnetic (EM) noise and thermal run away problems depending upon the method of switching. The gate terminal voltage and current control is common method of switching any semiconductor devices. In general, high rate of change of gate triggering currents are recommended for fast turning ON and turning OFF the switching devices. The high rate of change of currents (both gating and main circuit) interact with inductive and capacitive circuits associated with the semiconductor switching device and cause electromagnetic noise in the circuit. As per the international standards, the EM noise (conductive and radiated) should be within a predefined limit. In order to bring noise levels down, the switching devices must operate with high turn ON and Turn OFF times.

However, operating the semiconductor-switching device at high turn ON and turn OFF times leads to more switching loss. thermal behaviour. The more switching losses intern led to switch thermal runaway issues.

Hence it is evident that there is a trade-off between the EM noise and thermal run away issues. Conventional systems address either of regulation of EM noise or reducing thermal problems in the semiconductor switching device.

FIG. 1A shows a conventional circuit for controlling amplitude of gate current of a semiconductor switching device. Here, $C_{GS}$ refers to capacitance of gate terminal and source terminal of the semiconductor switching device. A voltage across the capacitor $C_{GS}$ decides ON time and OFF time of the semiconductor switching device. Very fast charging of Cgs causes EM noise issues thermal behaviour slow switching leads to long interval of ON time and OFF time leading to switch thermal run away problems.

FIG. 1B shows a conventional circuit for contrsolling gate current of a semiconductor switching device. Here, an inductor is placed at input gate terminal of the semiconductor switching device. The inductor can be used to regulate gate current, thereby try to operate the semiconductor switching device high turn ON and turn OFF intervals thereby reduce the electromagnetic noise problems but provoke thermal issues. However, value of inductance varies with different circuits. The value of inductance has to be calculated for individual circuit. Therefore, the circuit of FIG. 1B does not provide a common solution that can be utilized for different circuits associated with the semiconductor switching device.

The information disclosed in this background of the disclosure section is only for enhancement of understanding of the general background of the invention and should not be taken as an acknowledgement or any form of suggestion that this information forms the prior art already known to a person skilled in the art.

SUMMARY

In an embodiment, the present disclosure discloses a circuit for controlling gate current of a semiconductor switching device. The circuit comprises a current controlled variable inductor connected to a gate terminal of the semiconductor switching device and a feedback control circuit. The feedback control circuit comprises a differential module to compute instantaneous rate of change of gate current with respect to time, a reference generator to generate a reference signal and a control unit to regulate value of inductance of the variable inductor for controlling the gate current of the semiconductor switching device.

In an embodiment, the present disclosure discloses a method for controlling gate current of a semiconductor switching device. The method comprises providing a gate current to a gate terminal of the semiconductor switching device through a current controlled variable inductor. The instantaneous rate of change of the gate current with time computing by generating a reference voltage based on a reference parameters and measured parameters, and regulating inductance value of the variable inductor by generating a current based on an error signal, wherein the error signal is calculated based on the instantaneous rate of change of the gate current and the reference voltage, thereby controlling the gate current of the semiconductor switching device.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE ACCOMPANYING DRAWINGS

The novel features and characteristic of the disclosure are set forth in the appended claims. The disclosure itself, however, as well as a preferred mode of use, further objectives and advantages thereof, will best be understood by reference to the following detailed description of an illustrative embodiment when read in conjunction with the accompanying figures. One or more embodiments are now described, by way of example only, with reference to the accompanying figures wherein like reference numerals represent like elements and in which:

Figure 1A:
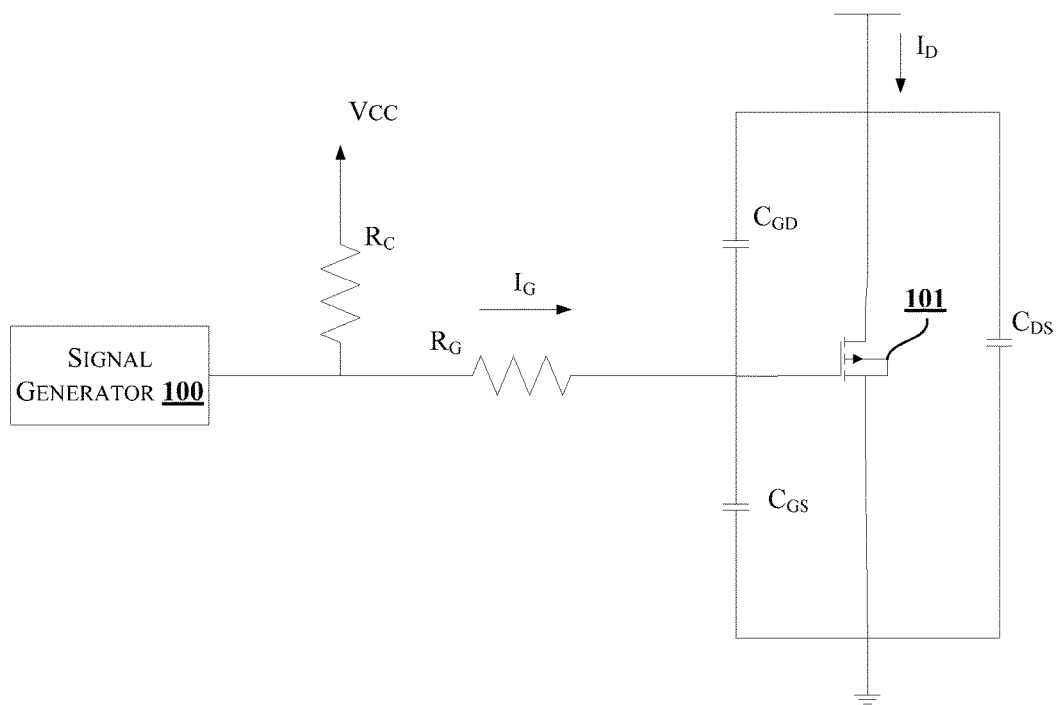
FIG. 1A shows a conventional circuit for controlling gate current of a semiconductor switching device.
Figure 1B:
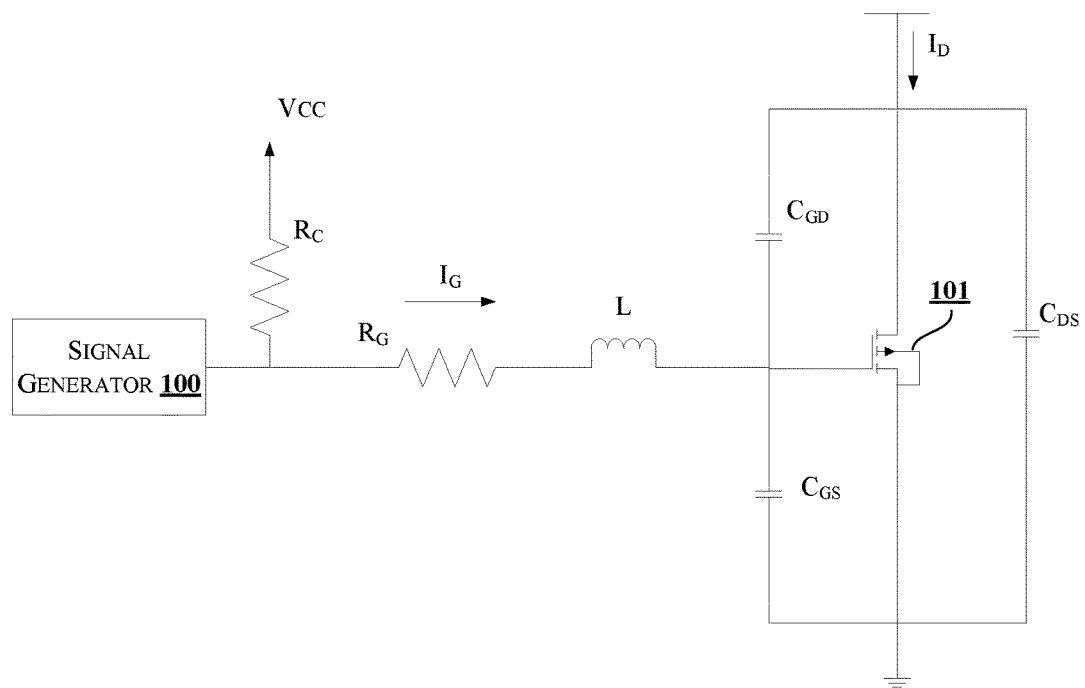
FIG. 1B shows a conventional circuit with an inductor for regulating gate current of the semiconductor switching device.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and executed by a computer or processor, whether or not such computer or processor is explicitly shown.

DETAILED DESCRIPTION

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the particular forms disclosed, but on the contrary, the disclosure is to cover all modifications, equivalents, and alternative falling within the scope of the disclosure.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or apparatus.

Embodiments of the present disclosure relate to a circuit for controlling gate current of a semiconductor switching device. The circuit computes an instantaneous rate of change of gate current with respect to time. Further, the circuit generates a reference voltage based on which inductance value of a variable inductor is regulated. The regulated variable inductor produces a current thus regulating the gate current. The regulated gate current is used to optimally operate the semiconductor switching device.

Figure 2:
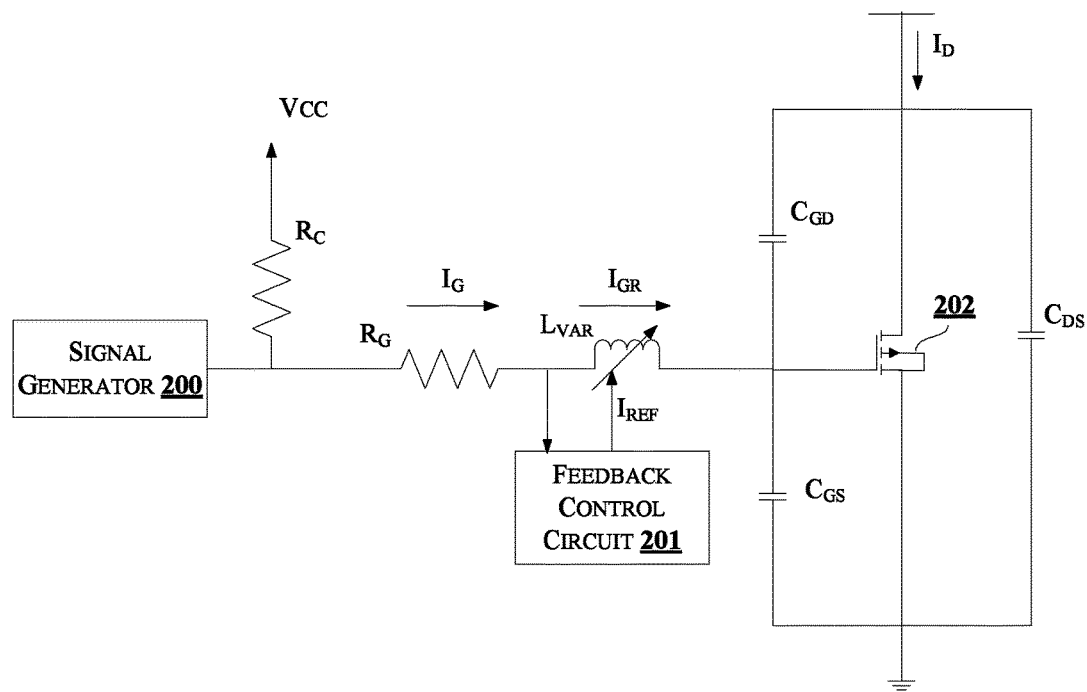
FIG. 2 shows a circuit for controlling gate current of a semiconductor switching device in accordance with some embodiments of the present disclosure.

FIG. 2 shows a circuit for controlling gate current of a semiconductor switching device. The circuit comprises a signal generator 200, a gate resistor $R_G$, a voltage source $V_{CC}$, a resistor $R_C$, a variable inductor $L_{VAR}$, a feedback control circuit 201, a semiconductor switching device 202, a capacitor $C_{GS}$, a capacitor $C_{GD}$ and a capacitor $C_{DS}$. The semiconductor switching device 202 has a gate terminal, a source terminal and a drain terminal. The gate terminal is connected to the signal generator 200 through the variable inductor $L_{VAR}$ and the gate resistor $R_G$. A current flowing through the gate resistor $R_G$ is denoted by $I_G$. The current $I_G$ flows to the gate terminal of the semiconductor switching device 202. The feedback control circuit 201 collects the current $I_G$ and computes a value of instantaneous rate of change of the current $I_G$ with respect to time. Further, the feedback control circuit 201 generates a reference current $I_{REF}$. The reference current $I_{REF}$ regulates value of inductance of the variable inductor $L_{VAR}$, thus altering the gate current $I_G$. The altered gate current is referred as the regulated gate current $I_{GR}$ which operates the semiconductor switching device 202 optimally.

In an embodiment, the semiconductor switching device 202 may include, but is not limited to, Field Effect Transistor, (FET), Metal Oxide Semiconductor Field Effect Transistor (MOSFET) and Junction Field Effect Transistor (J-FET). Insulated gate bipolar transistor (IGBT), Bipolar junction transistor (BJT)

Figure 3:
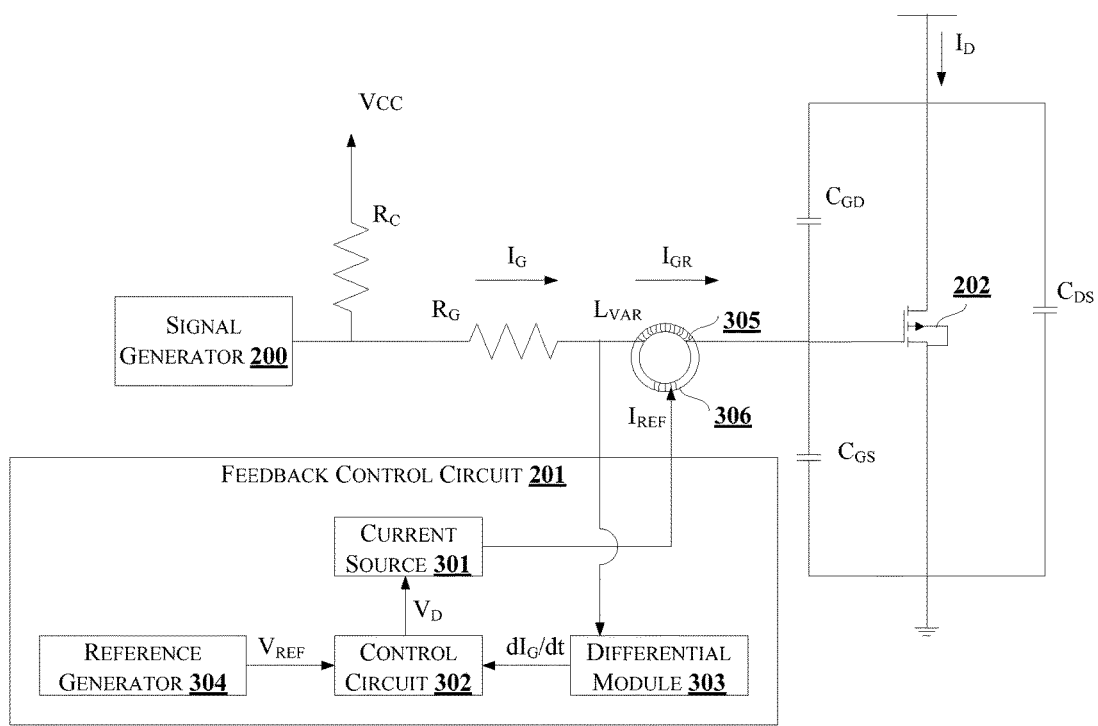
FIG. 3 illustrates implementation of a feedback control circuit for controlling gate current of a semiconductor switching device in accordance with some embodiments of the present disclosure.

FIG. 3 illustrates implementation of a feedback control circuit 201 for controlling gate current of a semiconductor switching device in accordance with some embodiments of the present disclosure. The feedback control circuit 201 comprises a current source 301, a control circuit 302, a differential module 303 and a reference generator 304. The current source 301 is connected to an auxiliary winding 306 of the variable inductor $L_{VAR}$. The auxiliary winding 306 induces a current in primary winding 305 of the variable inductor $L_{VAR}$ based on current applied to the auxiliary winding 306. The current induced at the primary winding 305 helps in controlling the gate current $I_G$, and the current emerging out of the primary coil 305 is the regulated gate current $I_{GR}$. The differential module 303 draws the gate current $I_G$ from the gate terminal of the semiconductor switching device 202. Further, the differential module 303 computes an instantaneous rate of change of the gate current $I_G$ with respect to time. The instantaneous rate of change of gate current $I_G$ with respect to time may be represented as $dI_G/dt$ herein in the present disclosure. Then, the differential module 303 provides the $dI_G/dt$ to the control circuit 302. Also, the reference generator 304 generates a reference voltage, and provides the reference voltage to the control circuit 302.

The reference generator 304 provides a reference voltage $V_{REF}$. The reference voltage $V_{REF}$ is a function of reference electromagnetic noise 401 of the circuit and reference thermal behavior of the semiconductor switching device 403. The reference electromagnetic noise 401 and reference thermal behaviour 403 are the values when the device is operated at its optimal level.

Figure 4:
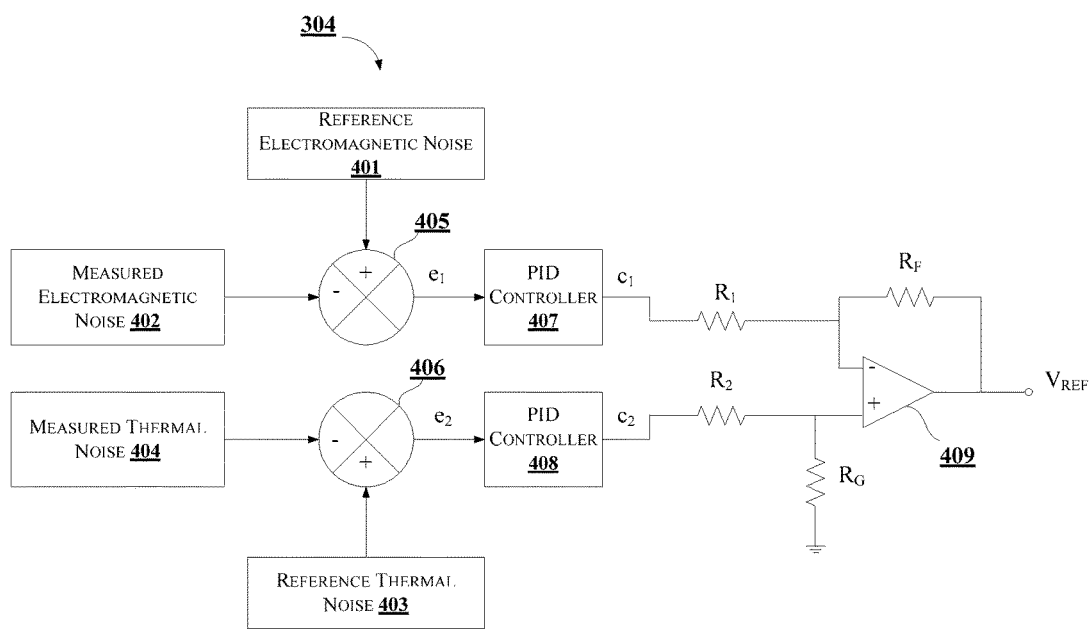
FIG. 4 shows an exemplary circuit for generating a reference voltage for controlling gate current of a semiconductor switching device in accordance with some embodiments of the present disclosure.

Referring now to FIG. 4, where the reference generator 304 circuit is shown with more details. The reference generator 304 receives a reference electromagnetic noise 401, reference thermal behavior 403, measured electromagnetic noise 402 from a noise determination module (not shown in figure) and measured thermal behaviour 404 from a behavior determination module (not shown in figure). The reference generator 304 comprises first summation block 405, a second summation block 406, a first Proportional Integral Derivative (PID) controller 407, a second PID controller 408 and an Operational Amplifier (Op-Amp) 409. The measured electromagnetic noise 402 and the measured thermal behaviour 404 may include noise measurements of the semiconductor switching device 202 and the circuit of FIG. 2. The first summation block 405 receives the reference electromagnetic noise 401 signal and the measured electromagnetic noise 402 signal from the noise determination module. Further, the first summation block 405 determines an error $e_1$ between the reference electromagnetic noise 401 signal and the measured electromagnetic noise 402 signal. Likewise, the second summation block 406 determines an error $e_2$ between the reference behavior 403 and the measured thermal behaviour 404. Here, the reference electromagnetic noise 401 and the reference thermal behaviour 403 refers to reference parameters required for the semiconductor switching device to be operated in optimal level. In an embodiment, the reference electromagnetic noise 401 is computed by a noise determination module and the reference thermal behavior 403 is computed by a behavior determination module. Further, the first PID controller 407 receives the $e_1$ and determines amount of correction required for the measured electromagnetic noise 402 signal to match the reference electromagnetic noise 401 signal, and a first correction signal $c_1$ is generated by the first PID controller 407. Likewise, the second PID controller 408 receives the $e_2$ and determines amount of correction required for the measured thermal behaviour 404 signal to match the reference thermal behavior 403 signal, and a second correction signal $c_2$ is generated by the second PID controller 408. Further, the first PID controller 407 and the second PID controller 408 provides the first correction signal $c_1$ and the second correction signal $c_2$ to the Op-Amp 409 respectively. The Op-Amp 409 is operated as a differential amplifier. In an embodiment, the first correction signal $c_1$ is provided to the Op-Amp 209 at an inverting terminal, and the second correction signal $c_2$ is provided at a non-inverting terminal of the Op-Amp 209. The Op-Amp 209 produces an output reference voltage $V_{REF}$ equivalent to difference of the first correction signal and the second correction signal. Further, the reference voltage $V_{REF}$ is provided to the control circuit 302. The reference voltage $V_{REF}$ is calculated using equation 1 as given below:

$$V_{REF} = -(c_1)(R_F/R_1) + (c_2)((R_1+R_F)/R_1)(R_G/R_G+R_2)) \quad (1)$$

where:
$R_1$ and $R_2$=input resistors;
$R_F$=feedback resistor; and
$R_G$=ground resistor.

Referring to FIG. 3, the control circuit 302 compares the reference voltage $V_{REF}$ and the $dI_G/dt$ and determines a difference between the reference voltage $V_{REF}$ and the $dI_G/dt$. The difference voltage may be denoted as $V_D$. In an embodiment, the $V_D$ denotes amount of correction in voltage required for the $dI_G/dt$ to match the reference voltage $V_{REF}$. Further, the control circuit 302 determines value of a reference current $I_{REF}$ corresponding to the $V_D$ for applying to a variable inductor. In one embodiment, the reference current $I_{REF}$ is applied to the auxiliary windings 306 of the variable inductor $L_{VAR}$. The control circuit 302 provides value of $I_{REF}$ to the current source 301. The current source 301 generates the reference current $I_{REF}$ and provides the reference current $I_{REF}$ to the auxiliary windings 306. The auxiliary windngs 306 and the primary windngs 305 are wound over a common core. Thus, the auxiliary windngs 306 induces a current in the primary windings 305. Thus, the induced current in the primary windngs 305 regulates value of inductance of the variable inductor $L_{VAR}$. The varied inductance causes changes in the current $I_G$ flowing through the variable inductor $L_{VAR}$. The changed current flowing through the variable inductor $L_{VAR}$ is the regulated gate current $I_{GR}$. The regulated current $I_{GR}$ controls the gate terminal of the semiconductor switching device 202 optimally.

Figure 5:
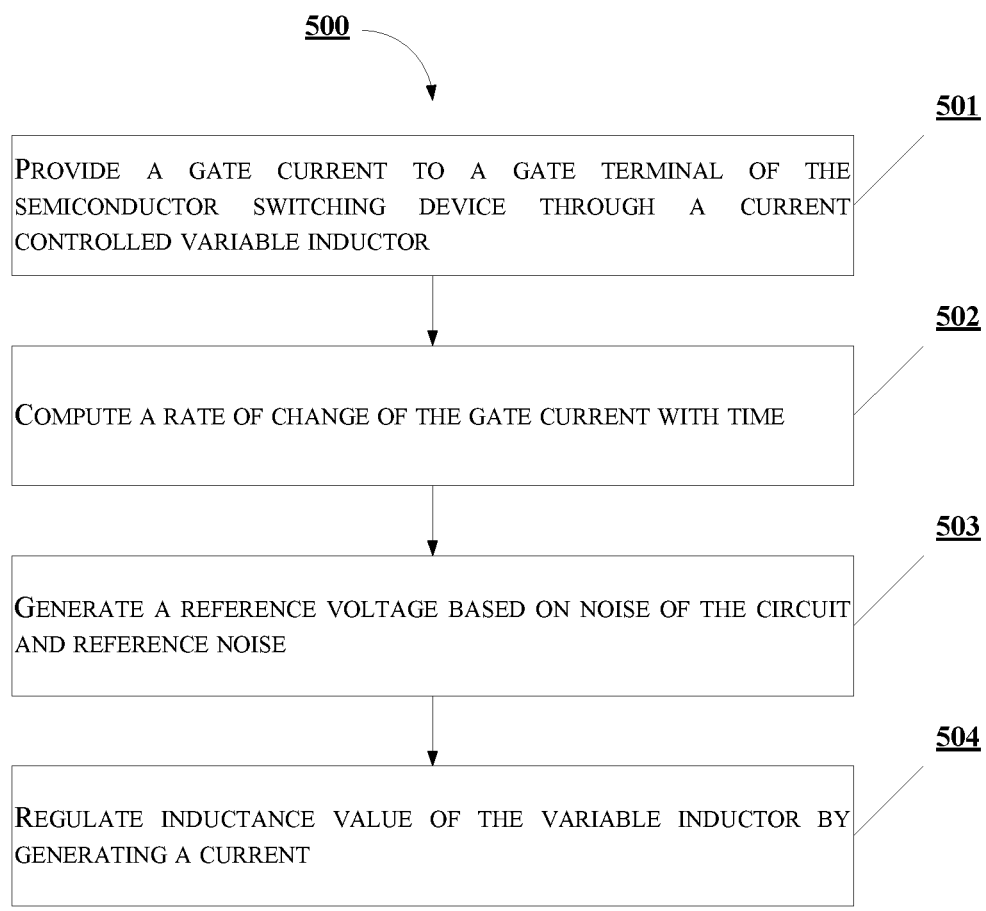
FIG. 5 shows an exemplary flow chart illustrating method steps for controlling gate current of a semiconductor switching device in accordance with some embodiments of the present disclosure.

FIG. 5 shows a flow chart illustrating a method for controlling gate current of a semiconductor switching device 202, in accordance with some embodiments of the present disclosure.

As illustrated in FIG. 5, the method 500 may comprise one or more steps for controlling gate current of a semiconductor switching device 202. The method 500 may be described in the general context of computer executable instructions. Generally, computer executable instructions can include routines, programs, objects, components, data structures, procedures, modules, and functions, which perform particular functions or implement particular abstract data types.

The order in which the method 500 is described is not intended to be construed as a limitation, and any number of the described method blocks can be combined in any order to implement the method. Additionally, individual blocks may be deleted from the methods without departing from the spirit and scope of the subject matter described herein. Furthermore, the method can be implemented in any suitable hardware, software, firmware, or combination thereof.

At step 501, the signal generator 200 provides a gate current $I_G$ to the gate terminal of the semiconductor switching device 202 through the variable inductor $L_{VAR}$. Here, the signal generator 200 generates the current $I_G$ for operating the gate terminal of the semiconductor switching device 202.

At step 502, the differential module 303 computes the $dI_G/dt$. The differential module 303 computes the gate current $I_G$ from the gate terminal of the semiconductor switching device 202. Further, the differential module 303 determines rate at which the gate current $I_G$ changes with respect to time.

At step 503, the reference generator 304 generates a reference voltage $V_{REF}$. The reference generator 304 is provided with a reference electromagnetic noise 401, and the reference thermal behavior 403 signals. Further, the reference generator 304 receives the measured electromagnetic noise 402 signals and the measured thermal behaviour 404 signals from the noise determination unit and the behaviour determination unit respectively. Then, the first summation module 405 determines the error $e_1$ between the reference electromagnetic noise 401 signal and the measured electromagnetic noise 402 signal. Then, the first PID controller receives the $e_1$ and generates the first correction signal $c_1$. Likewise, the second summation module 406 determines the error $e_2$ between the reference thermal behaviour 403 signal. Then, the second PID controller 408 receives the $e_2$ and generates the second correction signal $c_2$. Further, the first correction signal $c_1$ and the second correction signal $c_2$ are provided to the Op-Amp 409. The Op-Amp 409 is constructed as a differential amplifier. Thus, the Op-Amp 409 outputs difference of the first correction signal $c_1$ and the second correction signal $c_2$. The output of the Op-Amp 409 is the reference voltage $V_{REF}$.

At step 504, the control circuit 302 receives the reference voltage $V_{REF}$ from the reference generator 304 and the $dI_G/dt$ from the differential module 303. Further, the control circuit 302 compares the reference voltage $V_{REF}$ and the $dI_G/dt$ and determines the difference voltage $V_D$. The $V_D$ indicates amount of correction in voltage required for the $dI_G/dt$ to match the reference voltage $V_{REF}$. Further, the control circuit 302 determines value of a reference current $I_{REF}$ corresponding to the correction in voltage for applying to the auxiliary windings 306 of the variable inductor $L_{VAR}$. The control circuit 302 provides value of $I_{REF}$ to the current source 301. The current source 301 generates the reference current $I_{REF}$ and provides the reference current $I_{REF}$ to the auxiliary windings 306. The $I_{REF}$ in the auxiliary windngs 306 induces a current in the primary windings 305. Thus, the induced current in the primary windngs 305 regulates the value of inductance of the variable inductor $L_{VAR}$. The regulation causes change in the gate current $I_G$. The change in the gate current $I_G$ is the regulated gate current $I_{GR}$. The regulated gate current $I_{GR}$ is provided to the gate terminal of the semiconductor switching device 202 for optimally operating the semiconductor switching device 202.

Figure 6:
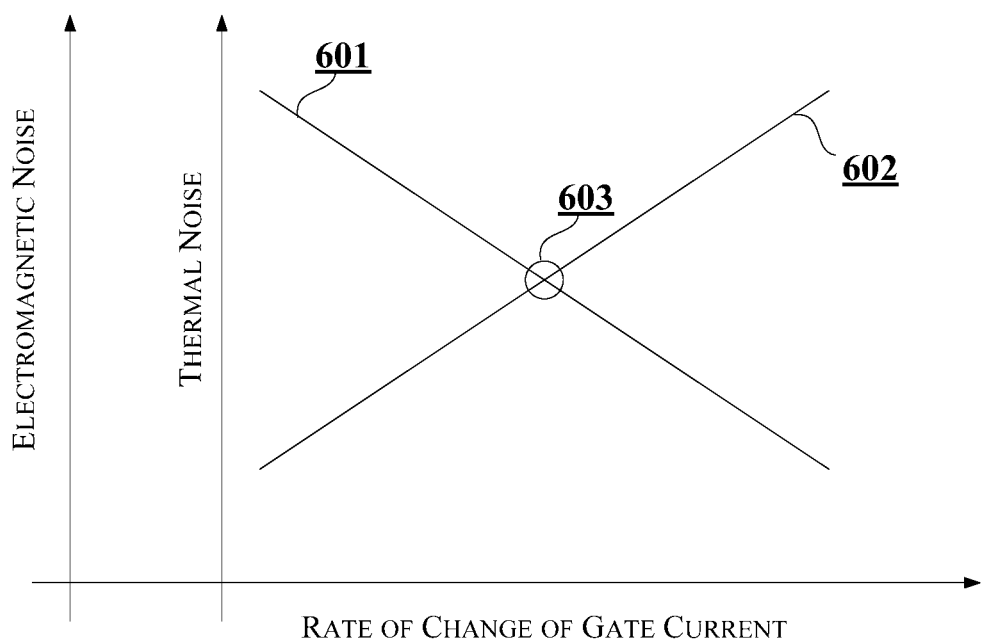
FIG. 6 shows a graph illustrating optimal operating point of the semiconductor switching device in accordance with some embodiments of the present disclosure.

FIG. 6 shows a graph illustrating optimal operating point of the semiconductor switching device 202 in accordance with some embodiments of the present disclosure. The graph comprises measured electromagnetic noise 402 and measured thermal behaviour 404 on vertical axis and $dI_G/dt$ on horizontal axis. The graph shows variation of the measured electromagnetic noise 402 and the measured thermal behaviour 404 with respect to $dI_G/dt$. The lines 601 represents the measured thermal behaviour 404 and the line 602 represents the measured electromagnetic noise 402. From the graph, it is evident that as dI/dt increases, values of the measured electromagnetic noise 402 increases and value of the measured thermal behaviour 404 decreases. Thus, the semiconductor switching device 202 has to be operated at an optimal point. 603 indicates an optimal point for operating the semiconductor switching device 202. At 603, the measured electromagnetic noise 402 and the measured thermal behaviour 404 are balanced and are consider at reference electromagnetic noise 401 and the reference thermal behavior 403. Thus, the regulated gate current $I_{GR}$ operates the semiconductor switching device 202 at the optimal point 603. In an embodiment, semiconductor switching device 202 may be operated around the optimal point 603 for producing optimal results.

In an embodiment, the optimal point 603 can be dynamically calculated by continuous monitoring of the gate current $I_G$. Here, the feedback control circuit 201 may draw the gate current $I_G$ at predefined intervals of time to monitor and calculate the optimal point 603.

The terms "an embodiment", "embodiment", "embodiments", "the embodiment", "the embodiments", "one or more embodiments", "some embodiments", and "one embodiment" mean "one or more (but not all) embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise. The terms "a", "an" and "the" mean "one or more", unless expressly specified otherwise.

A description of an embodiment with several components in communication with each other does not imply that all such components are required. On the contrary a variety of optional components are described to illustrate the wide variety of possible embodiments of the invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

The illustrated operations of FIG. 5 show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

In an embodiment, the present disclosure discloses a circuit for operating the semiconductor switching device at the optimal point, by regulating value of inductance of the variable inductor.

In an embodiment, the present disclosure provides a user flexibility to choose the optimal point for operating the semiconductor switching device based on user requirement.

In an embodiment, the present disclosure provides a method and circuit for dynamic calculation of the optimal point. Thus, the optimal point may vary and the semiconductor switching device may be adjusted to operate at the varied optimal point.

In an embodiment, the present disclosure provides a method and circuit for reducing the electromagnetic noise and the thermal behaviour.

In an embodiment, the circuit disclosed in the present disclosure can be integrated with existing circuits. Thus, the circuit of present disclosure does not incur additional cost.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the disclosure of the embodiments of the invention is intended to be illustrative, but not limiting, of the scope of the invention, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

REFERRAL NUMERALS:

| Reference number | Description |
| --- | --- |
| 200 | Signal generator |
| 201 | Feedback control circuit |
| 202 | Semiconductor switching device |
| 301 | Current source |
| 302 | Control circuit |
| 303 | Differential module |
| 304 | Reference generator |
| 305 | Primary winding |
| 306 | Auxiliary winding |
| 401 | Reference electromagnetic noise |
| 402 | Measured electromagnetic noise |
| 403 | Reference thermal behavior |
| 404 | Measured thermal behaviour |
| 405 | First summation module |
| 406 | Second summation module |
| 407 | First PID controller |
| 408 | Second PID controller |
| 409 | Op-Amp |

I claim:

1. A circuit for controlling gate current of a semiconductor switching device, comprising:

a current controlled variable inductor connected between a power source and a gate terminal of the semiconductor switching device; and a feedback control circuit comprising:

a differential module to sense an instantaneous rate of change of a gate current with time, wherein the gate current is received from the gate terminal of the semiconductor switching device;

a reference generator to generate a reference signal based on reference parameters and measured parameters; and a control circuit to regulate inductance value of the variable inductor by generating a current based on an error signal, wherein the error signal is calculated based on the instantaneous rate of change of the gate current and the reference voltage, thereby controlling the gate current of the semiconductor switching device.

2. The circuit as claimed in claim 1, wherein the reference parameters are at least one of Electro-Magnetic (EM) noise of the circuit and thermal behavior of the semiconductor switching device.

3. The circuit as claimed in claim 1, wherein the measured parameters are at least one of Electro-Magnetic (EM) noise of the circuit and thermal behavior of the semiconductor switching device.

4. The circuit as claimed in claim 3, further comprises a noise determination unit for determining the EM noise from the circuit and a behavior determination unit for determining behavior of the semiconductor switching device.

5. The circuit as claimed in claim 1, wherein the reference parameters indicates optimal region of operation of the semiconductor switching device.

6. The circuit as claimed in claim 1, wherein the feedback control circuit comprises a current source for generating the current based on the error signal.

7. A method for controlling gate current of a semiconductor switching device, comprising:

providing a gate current to a gate terminal of the semiconductor switching device through a current controlled variable inductor;

sensing an instantaneous rate of change of the gate current with time, wherein the gate current is received from the gate terminal of the semiconductor switching device;

generating a reference signal based on a reference parameters and measured parameters;

and regulating inductance value of the variable inductor by generating a current based on an error signal, wherein the error signal is calculated based on the instantaneous rate of change of the gate current and the reference voltage, thereby controlling the gate current of the semiconductor switching device.

8. The method as claimed in claim 7, wherein the reference parameters are at least one of Electro-Magnetic (EM) noise of the circuit and thermal behavior of the semiconductor switching device.

9. The method as claimed in claim 7, wherein the measured parameters are at least one of Electro-Magnetic (EM) noise of the circuit and thermal behavior of the semiconductor switching device.

10. The method as claimed in claim 7, wherein determining the EM noise from the circuit is performed by a noise determination unit and determining behavior of the semiconductor switching device is performed by a behavior determination unit.

11. The method as claimed in claim 7, wherein the reference parameters indicates optimal region of operation of the semiconductor switching device.

12. The method as claimed in claim 7, wherein the feedback control circuit comprises a current source for generating the current based on the error signal.

\* \* \* \* \*